(12) United States Patent
Izumida

(10) Patent No.: US 10,535,712 B2
(45) Date of Patent: Jan. 14, 2020

(54) SEMICONDUCTOR DEVICE

(71) Applicant: TOSHIBA MEMORY CORPORATION, Minato-ku, Tokyo (JP)

(72) Inventor: Takashi Izumida, Kamakura Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/128,150

(22) Filed: Sep. 11, 2018

(65) Prior Publication Data

US 2019/0288036 A1    Sep. 19, 2019

(30) Foreign Application Priority Data

Mar. 14, 2018 (JP) .................................. 2018-047290

(51) Int. Cl.
*H01L 27/24* (2006.01)
*H01L 45/00* (2006.01)

(52) U.S. Cl.
CPC ........ *H01L 27/2454* (2013.01); *H01L 27/249* (2013.01); *H01L 45/1226* (2013.01)

(58) Field of Classification Search
CPC ........................ H01L 27/249; H01L 27/2454; H01L 45/1226
See application file for complete search history.

(56) References Cited

U.S. PATENT DOCUMENTS

| 9,224,469 | B2 | 12/2015 | Minemura et al. |
| 9,231,029 | B2 | 1/2016 | Murooka |
| 9,343,507 | B2 * | 5/2016 | Takaki ................ H01L 27/2481 |
| 2016/0268339 | A1 | 9/2016 | Sakuma et al. |
| 2017/0271405 | A1 | 9/2017 | Toriyama et al. |

FOREIGN PATENT DOCUMENTS

| JP | 2015119179 A | 6/2015 |
| JP | 2016171221 A | 9/2016 |
| JP | 2017168698 A | 9/2017 |
| JP | 6215153 B2 | 10/2017 |

* cited by examiner

*Primary Examiner* — Allison Bernstein
(74) *Attorney, Agent, or Firm* — Holtz, Holtz & Volek PC

(57) ABSTRACT

A semiconductor device includes a substrate, a semiconductor layer, a first interconnection, a second interconnection and a control electrode. The semiconductor layer includes a first channel portion and a second channel portion. The first channel portion and the second channel portion extend in a first direction crossing a front surface of the substrate. The first interconnection is connected to one end of the semiconductor layer, and extends in a second direction along the front surface of the substrate. The second interconnection is connected to the other end of the semiconductor layer. The control electrode extends along the front surface of the substrate, and extends in a third direction crossing the second direction. The control electrode includes a portion positioned between the first channel portion and the second channel portion. The control electrode is electrically insulated from the semiconductor layer.

14 Claims, 8 Drawing Sheets

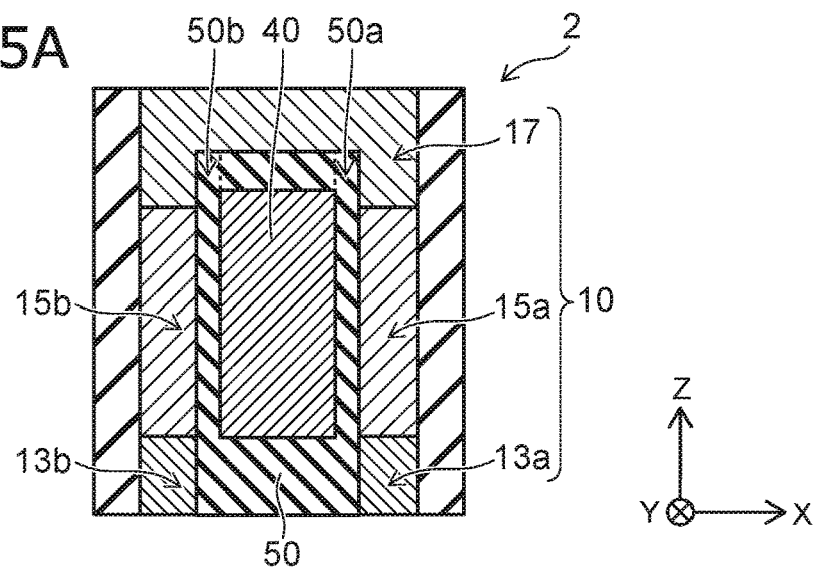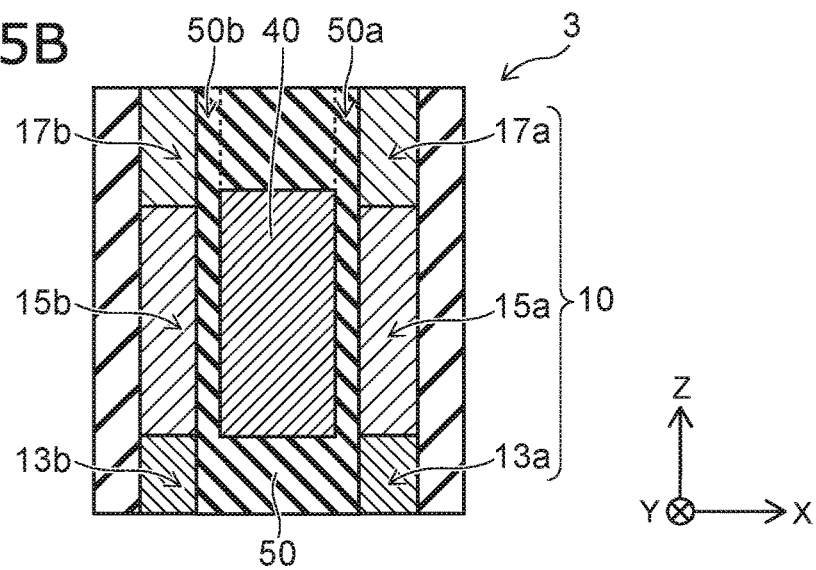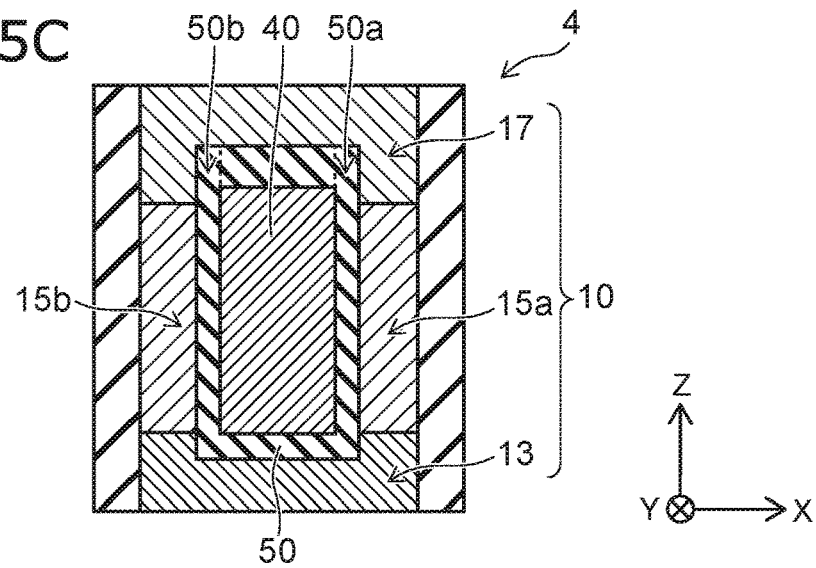

SEMICONDUCTOR DEVICE

CROSS-REFERENCE TO RELATED APPLICATIONS

This application is based upon and claims the benefit of priority from Japanese Patent Application No. 2018-047290, filed on Mar. 14, 2018; the entire contents of which are incorporated herein by reference.

FIELD

Embodiments relate to a semiconductor device.

BACKGROUND

A vertical transistor is known, which controls electric current flowing in a direction crossing a substrate surface. The vertical transistor connects, for example, an interconnection on the substrate and an interconnection thereabove, and controls the electric current on/off, which flows through the interconnections. When such transistors are placed on the substrate with higher density, spacing between the gate electrodes of the adjacent transistors is narrowed, and increases the gate to gate capacity. Thus, the vertical transistors have slower switching speed, and make it difficult to respond to high speed signals.

BRIEF DESCRIPTION OF THE DRAWINGS

FIGS. 5A to 5C are schematic cross-sectional views showing a semiconductor device according to a variation of the embodiment;

DETAILED DESCRIPTION

Figure 1:
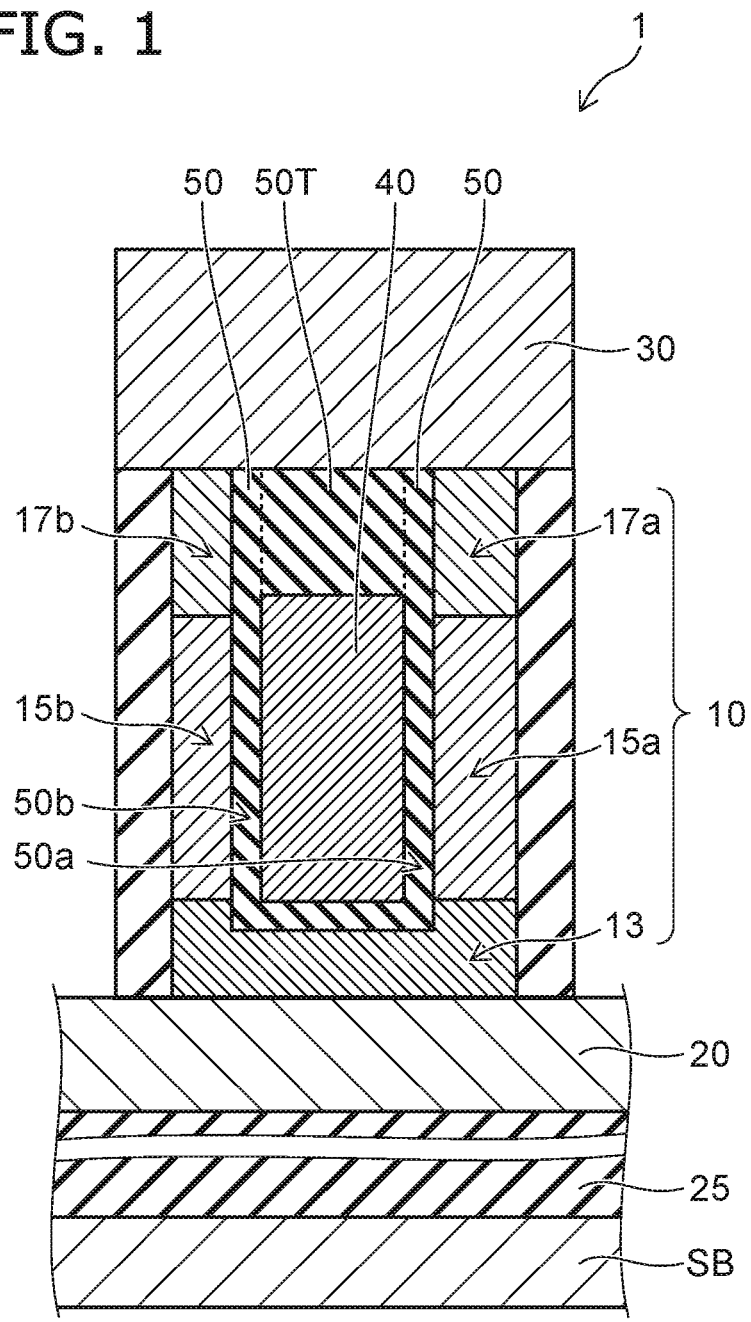
FIG. 1 is a schematic cross-sectional view showing a semiconductor device according to an embodiment.

According to one embodiment, a semiconductor device includes a substrate, a semiconductor layer, a first interconnection, a second interconnection and a control electrode. The semiconductor layer includes a first channel portion and a second channel portion. The first channel portion and the second channel portion extend in a first direction crossing a front surface of the substrate. The first interconnection is connected to one end of the semiconductor layer in the first direction, and extends in a second direction along the front surface of the substrate. The second interconnection is connected to the other end of the semiconductor layer in the first direction. The control electrode extends along the front surface of the substrate in a third direction crossing the second direction. The control electrode includes a portion positioned between the first channel portion and the second channel portion. The control electrode is electrically insulated from the semiconductor layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. The semiconductor device 1 is, for example, a vertical transistor, and includes a semiconductor layer 10, a gate electrode 40, and a gate insulating film 50.

The semiconductor layer 10 includes a first channel portion 15a and a second channel portion 15b. The first channel portion 15a and the second channel portion 15b extend in the Z-direction crossing a surface of a substrate SB. The semiconductor layer 10 is, for example, a polysilicon layer.

The gate electrode 40 includes a portion positioned between the first channel portion 15a and the second channel portion 15b, and extends in the Y-direction along the surface of the substrate SB. The gate electrode 40 is electrically insulated from the semiconductor layer 10 by the gate insulating film 50. The gate insulating film 50 includes a portion 50a positioned between the first channel portion 15a and the gate electrode 40 and a portion 50b positioned between the second channel portion 15b and the gate electrode 40.

One end in the Z-direction of the semiconductor layer 10 is connected to a first interconnection 20, and other end is connected to a second interconnection 30. The first interconnection 20 extends, for example, in the X-direction along the surface of the substrate SB.

The substrate SB is, for example, a silicon substrate, the first interconnection 20 is provided above the substrate SB, for example, via an insulating film 25. The second interconnection 30 is placed above the first interconnection 20, and extends, for example, in the Z-direction. The semiconductor device 1 is provided so as to control an electric current on/off, which flows through the first interconnection 20 and the second interconnection 30.

For example, the first channel portion 15a and the second channel portion 15b are combined together at least one of a top end and a bottom end of the semiconductor layer 10. In other word, the semiconductor layer 10 includes a source region 13 or a drain region 17 in which the first channel portion 15a and the second channel portion 15b are combined together. In the example shown in FIG. 1, the semiconductor layer 10 includes the source region in which the first channel portion 15a and the second channel portion 15b are combined together at the bottom ends, and includes a drain region 17a and a drain region 17b at the top ends of the first channel portion 15a and the second channel portion 15b, respectively.

The semiconductor layer 10 has a first impurity concentration in the portions of the first channel portion 15a and the second channel portion 15b facing the gate electrode 40. The semiconductor layer 10 has a second impurity concentration higher than the first impurity concentration in the source region 13 and the drain region 17. The first channel portion 15 and the second channel portion 15b include, for example, undoped regions in the portions facing the gate electrode 40. The source region 13 and the drain region 17 include, for example, an N-type impurity with a concentration higher than the concentration of an N-type impurity in the channel portion 15.

Hereinafter, the specification includes the cases where the first channel portion 15a and the second channel portion 15b are described individually, and are described inclusively as the channel portion 15. Also, other components are described in the same manner. The source region 13 and the drain region 17 are described illustratively. A drain region may be provided on the top end of the channel portion 15, and a source region may be provided on the bottom end thereof.

Figure 2A:
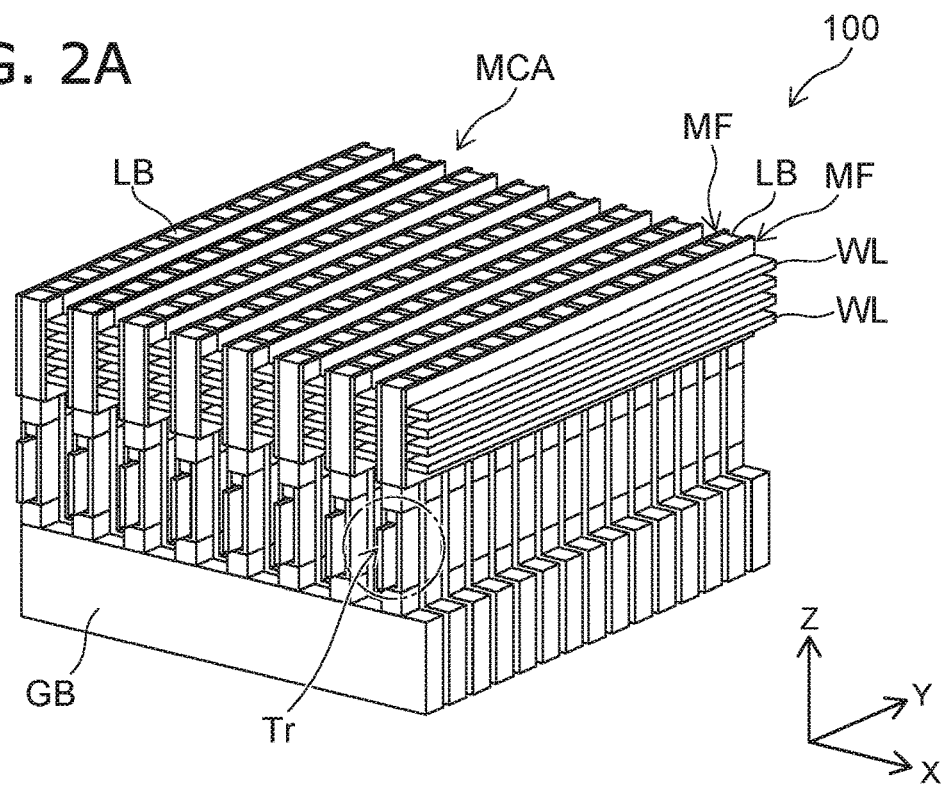
FIGS. 2A and 2B are perspective views schematically showing a memory device according to the embodiment.
Figure 2B:
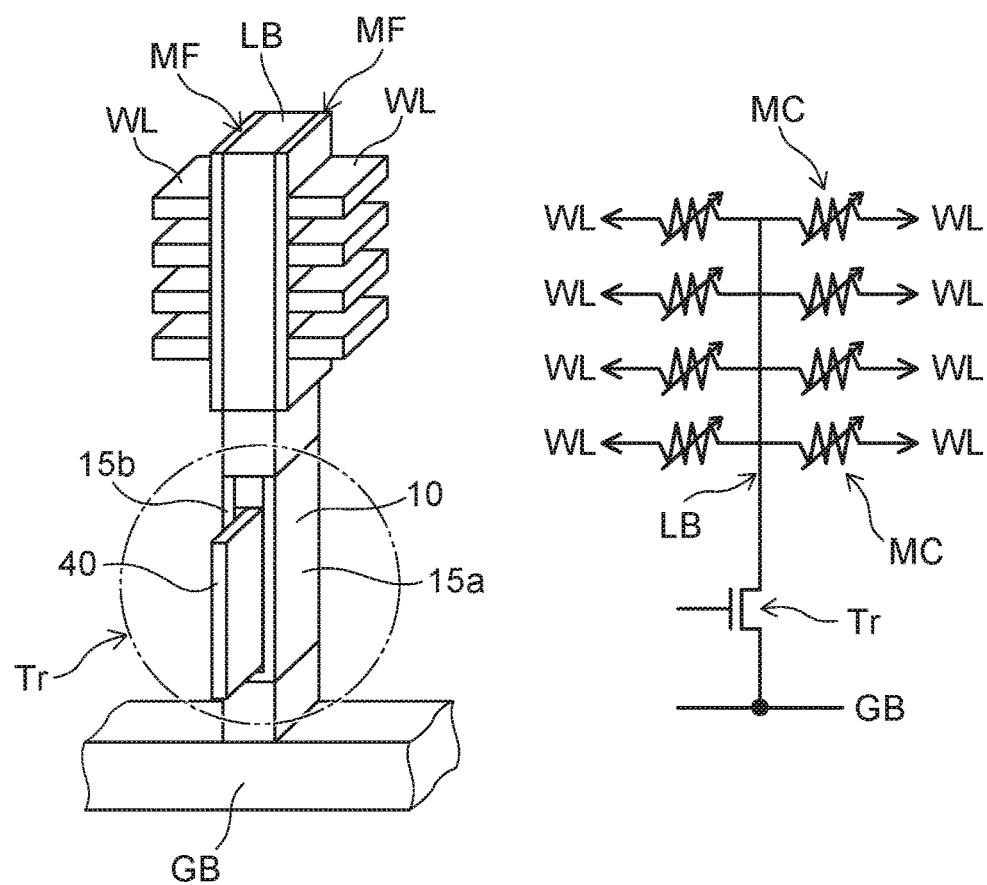

FIGS. 2A and 2B are perspective views schematically showing a memory device 100 according to the embodiment. The memory device 100 is a non-volatile memory device including three dimensionally disposed memory cells MC. FIG. 2A is a schematic view showing a memory cell array MCA of the memory device 100. FIG. 2B is a schematic view showing one unit of the memory cell array MCA.

As shown in FIG. 2A, the memory cell array MCA is provided above multiple first interconnections arranged in the Y-direction (hereinafter, global bit lines GB). The global lines GB extend respectively in the X-direction.

The memory cell array MCA includes the second interconnections (hereinafter, local bit lines LB), third interconnections (hereinafter, word lines WL), and memory films MF. The local bit lines LB extend in the Z-direction, and the word lines WL extend in the Y-direction. Multiple word lines WL are arranged in the Z-direction along a local bit lines LB. A memory film MF is placed between the local bit line LB and the multiple word lines WL.

As shown in FIG. 2B, a global bit line GB and a local bit line LB are connected via a transistor Tr. The transistor Tr has a structure, for example, same as the structure of the semiconductor device 1, and includes a semiconductor layer 10 and a gate electrode 40.

The semiconductor layer 10 is connected to the global bit line GB and the local bit line LB at the bottom end and the top end thereof, respectively. The semiconductor layer 10 includes the first channel portion 15a and the second channel portion 15b extending in the Z-direction. The gate electrode 40 extends in the Y-direction between the first channel portion 15a and the second channel portion 15b.

The local bit line LB extends in the Z-direction, and a pair of memory films MF are provided on the both sides thereof. The memory film MF is, for example, a resistance change film. The word lines WL are provided so as to cross the local bit line LB with the memory film MF interposed. The memory film MF include a portion in which electrical resistance value changes reversibly depending on a voltage applied between a word line WL and the local bit line LB or a electrical current flowing therethrough.

A memory cell MC is provided at a portion where the word line WL crosses the local bit line LB. The memory film MF includes a portion positioned between the local bit line LB and the word line WL and acting as a data storing portion of the memory cell MC.

In the memory device 100, the global bit line GB is connected to multiple local bit lines LB via transistors Tr. As the global bit lines GB are arranged in the Y-direction, the local bit lines LB are placed two-dimensionally, i.e., are arranged in the X-direction and the Y-direction, and extend in the Z-direction, for example. The word lines WL extend respectively in the Y-direction, and are provided so as to cross the multiple local bit lines LB.

In order to enlarge the memory capacity of the memory device 100, it is conceivable to reduce spacing between the global bit lines GB in the Y-direction, spacing between the local bit lines LB in the X-direction and spacing between the word lines WL in the Z-direction to increase the density of memory cells MC three-dimensionally disposed. Thus, spacing is also reduced between the transistors Tr in the X-direction and the Y-direction.

For example, parasitic capacitance between gate electrodes increases as the spacing between the transistors Tr are narrowed due to the increased density of memory cell MC in the memory device, which includes vertical transistors having the gate electrodes placed on both sides of the semiconductor layer 10. Thus, the vertical transistors have slower switching speed, and reduce the operation speed of memory cell array MCA.

In contrast, in the memory device 100 according to the embodiment, the gate electrode 40 of the transistor Tr is placed between the first channel portion 15a and the second channel portion 15b. Thereby, when the spacing between the transistors Tr is narrowed, it is possible to suppress the increase of parasitic capacitance between the gate electrodes 40, and to achieve the high speed operation in the memory cell array MCA.

Hereinafter, a manufacturing method of the semiconductor device 1 according to the embodiment will be described with reference to FIGS. 3A to 4B. FIGS. 3A to 4B are schematic views sequentially showing manufacturing processes of the semiconductor device 1.

Figure 3A:
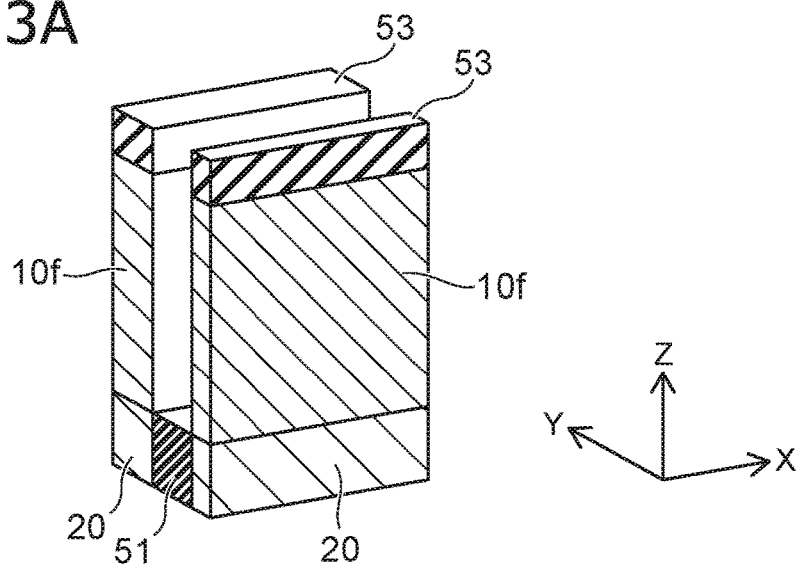
FIGS. 3A to 4B are perspective views schematically showing manufacturing processes of the semiconductor device according to the embodiment.

As shown in FIG. 3A, semiconductor layers 10f is formed on first interconnections 20. The semiconductor layers 10f are formed, for example, by selectively removing a polysilicon layer by using mask layers 53 after forming a polysilicon layer on the first interconnections 20 and insulating films 51 between the first interconnections 20. The polysilicon layer is formed, for example, by using Chemical Vapor Deposition (CVD), and N-type impurities are doped in a bottom portion and a surface portion through the deposition process.

Figure 3B:
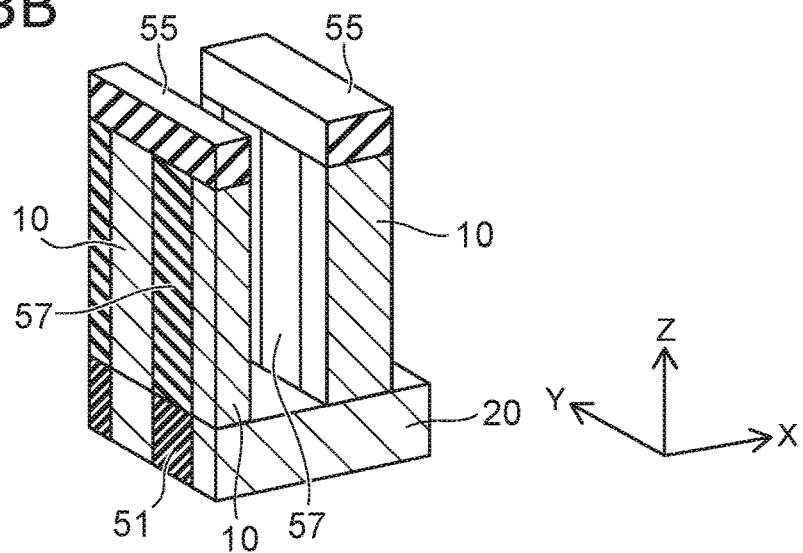

As shown in FIG. 3B, semiconductor layers 10 of columnar shape are formed on the first interconnections 20. For example, insulating films 57 are formed between the semiconductor layers 10f (see FIG. 3A), and then, the semiconductor layer 10 is formed by selectively removing the semiconductor layer 10f and the insulating film 57 using mask layers 55.

Figure 3C:
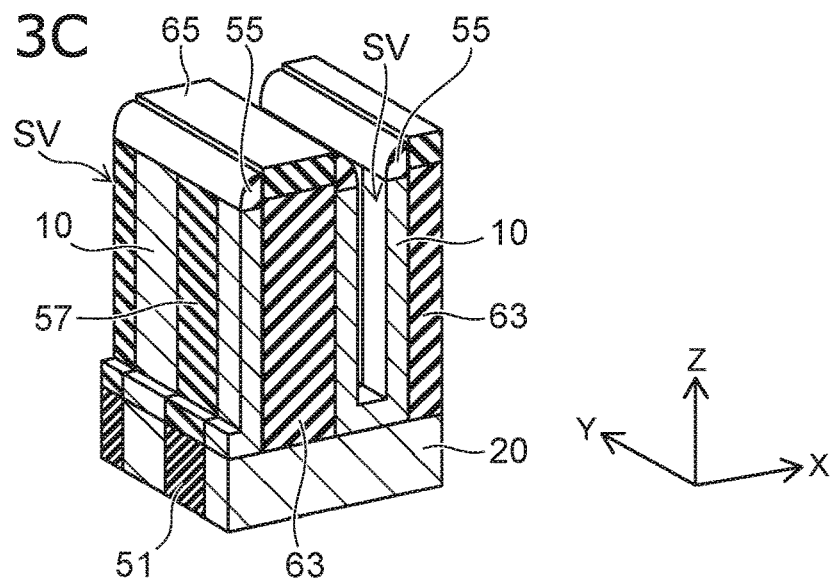

As shown in FIG. 3C, slits SV are formed to divide the semiconductor layers 10 of columnar shape. For example, the spaces provided by selectively removing the semiconductor layer 10f (see FIG. 3A) are filled with insulating films 63 and insulating films 65 and the insulating film 57, and then, the slits SV are formed using an etching mask (not shown) to divide the semiconductor layer 10, the insulating film 57 and the mask layers 55. The slits SV are formed, for example, to have a depth such that portions of the semiconductor layers 10 remain on the first interconnection 20 at the bottoms of the slits SV.

Figure 4A:
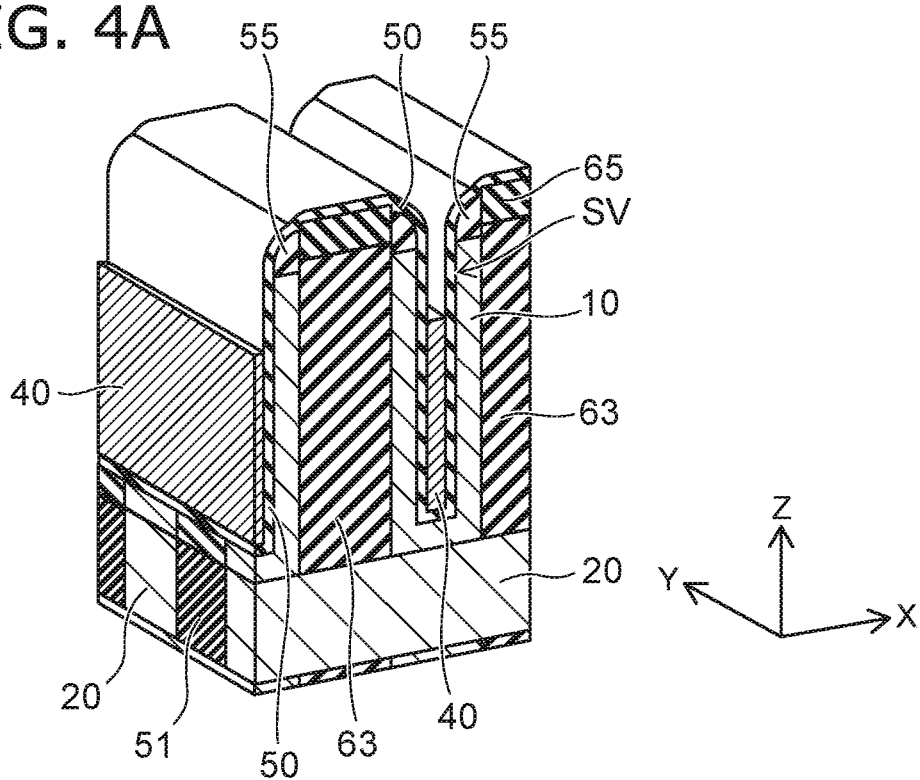

As shown in FIG. 4A, a gate insulating film 50 is formed to cover the inner surfaces of the slits SV. Further, the gate electrodes 40 are formed in the slits SV. The gate insulating film 50 is, for example, a silicon oxide film deposited using CVD. Alternatively, the gate insulating film 50 may be formed by thermally oxidizing the surfaces of the semiconductor layers 10 exposed at the inner surfaces of the slits SV. The gate electrodes 40 are formed, for example, through the processes of forming a metal film such as tungsten to fill the slits SV, and then, etching back the metal film.

Figure 4B:
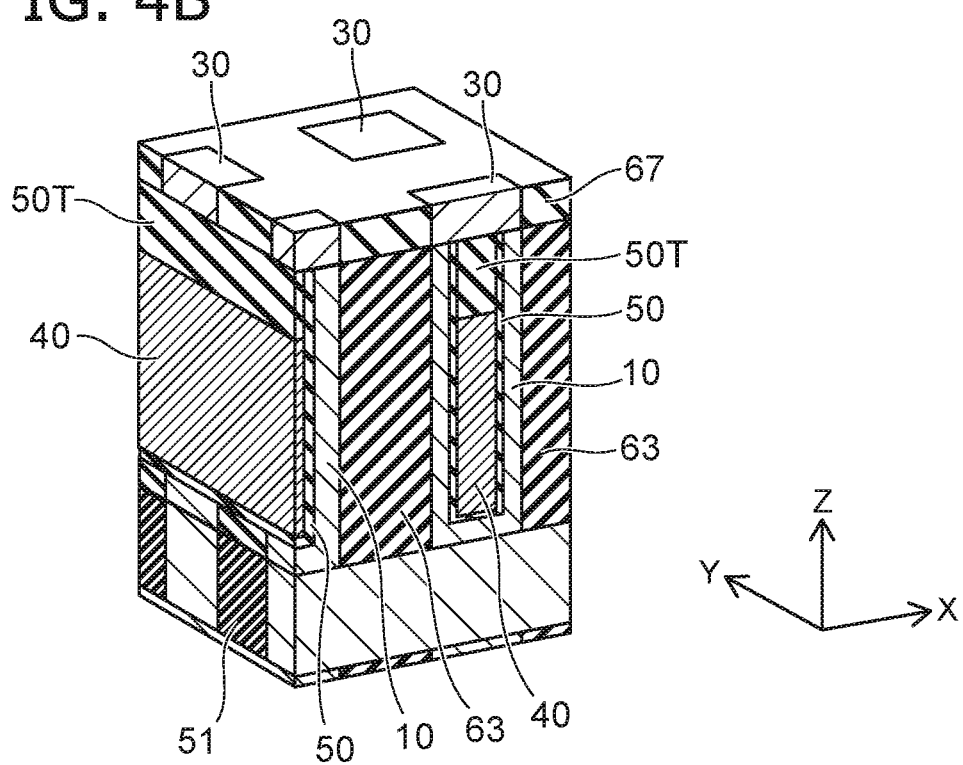

As shown in FIG. 4B, insulating films 50T are formed on the gate electrodes 40, and then, second interconnections 30 or connection parts of the second interconnections 30 are formed to be connect to the top ends of the semiconductor layers 10. For example, after the top portions of the slits SV are filled with the insulating films 50T, the upper structure including the mask layers 55 and the insulating films 65 or the like (see FIG. 4A) is removed, and then, an insulating film 67 is formed to cover the semiconductor layers 10 and the insulating films 50T and 63. Subsequently, openings are formed to communicate with the semiconductor layer 10 from a top surface of the insulating film 67, and the second interconnections 30 or the connection parts of the second interconnections 30 are formed in the openings.

FIGS. 5A to 5C are schematic cross-sectional views showing semiconductor devices 2 to 4 according to a variation of the embodiment. The semiconductor devices 2 to 4 each include the semiconductor layer 10 and the gate electrode 40. The gate electrode 40 is positioned between the first channel portion 15*a* and the second channel portion 15*b*.

In the semiconductor device 2 shown in FIG. 5A, the first channel portion 15*a* and the second channel portion 15*b* are combined together, and the drain region 17 is provided at the top end of the semiconductor layer 10. At the bottom end of the semiconductor layer 10, source regions 13*a* and 13*b* are provided, which are the bottom ends of the first channel portion 15*a* and the second channel portion 15*b*.

The semiconductor device 2 is formed, for example, by forming the slit SV so as to have a depth capable of reaching the first interconnection 20 in the manufacturing process shown in FIG. 3C, and forming a semiconductor layer connected to the first channel 15*a* and the second channel 15*b* on the gate insulating film 50 and the insulating film 50T in the manufacturing process shown in FIG. 4B. Thereby, it is possible to reduce the contact resistance by enlarging the contact area of the semiconductor layer 10 and the second interconnection 30 (see FIG. 1).

In the semiconductor device 3 shown in FIG. 5B, the first channel 15*a* and the second channel 15*b* are not combined together, and are connected at the top ends and bottom ends thereof to the first interconnection 20 and the second interconnection 30. The source region 13*a* is provided on the bottom end of the first channel portion 15*a*, and the drain region 17*a* is provided on the top end thereof. The source region 13*b* is provided on the bottom end of the second channel portion 15*b* and the drain region 17*b* is provided on the top end thereof.

The semiconductor device 3, for example, is formed in the case where the slits SV are formed to have a depth capable of reaching the first interconnection 20 in the manufacturing process shown in FIG. 3A. Thereby, the first channel portion 15*a* and the second channel portion 15*b* are formed to be spaced from each other by the gate insulating film 50. In the semiconductor device 3, it is possible to improve the manufacturing yield, because the depth control of the slits SV is easy in the manufacturing process shown in FIG. 3A.

In the semiconductor device 4 shown in FIG. 5C, the first channel portion 15*a* and the second channel portion 15*b* are combined together in both the top end and the bottom end of the semiconductor layer 10, and the source region 13 and the drain region 17 are provided therein.

The semiconductor device 4 is formed, for example, by forming a semiconductor layer connected to the first channel portion 15*a* and the second channel portion 15*b* on the gate insulating film 50 and the insulating film 50T in the manufacturing process shown in FIG. 4B. In the semiconductor device 4, the contact areas of the semiconductor layer 10 are enlarged, and thereby, the contact resistances are reduced at the bottom end connected to the first interconnection 20 and the top end connected to the second interconnection 30.

Hereinafter, another manufacturing method of the semiconductor device 3 according to the embodiment will be described with reference to FIGS. 6A to 7B. FIGS. 6A to 7B are schematic views sequentially showing manufacturing processes of the semiconductor device 3.

Figure 6A:
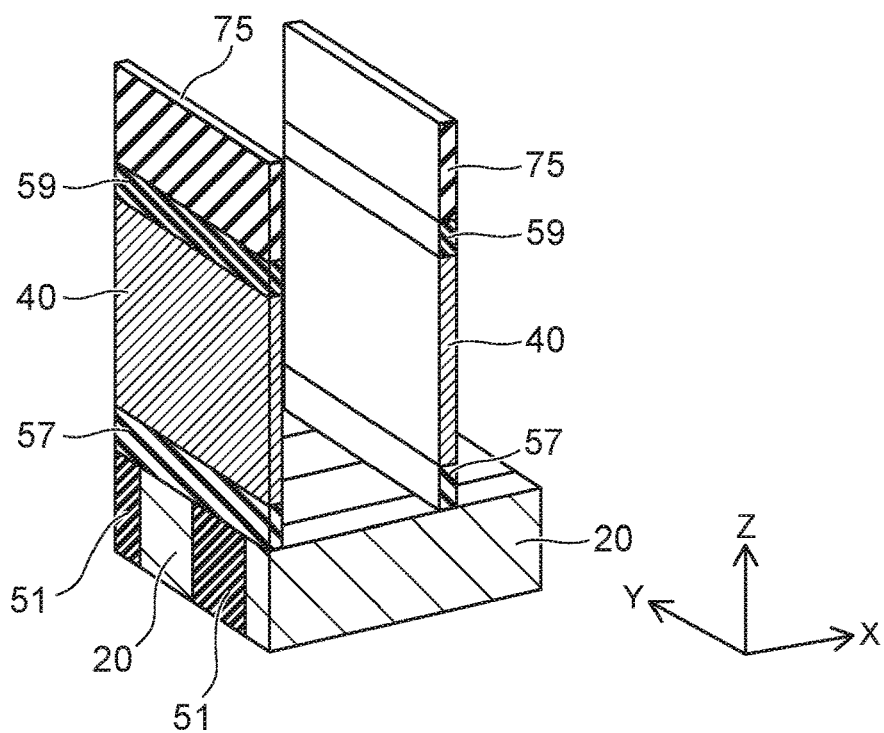
FIGS. 6A to 7B are perspective views schematically showing another manufacturing processes of the semiconductor device according to the embodiment.

As shown in FIG. 6A, the gate electrodes 40 are formed above the first interconnections 20. For example, an insulating film 57, a metal layer and an insulating film 59 are stacked on a plurality of first interconnections 20 arranged in the Y-direction. The insulating films 51 are provided between the adjacent first interconnections 20. The metal layer is formed into gate electrodes 40. Then, the insulating film 59, the metal film and the insulating film 57 are selectively removed using mask layers 75 to form the gate electrodes 40. The metal film that is to be the gate electrodes 40 is, for example, a tungsten film.

Figure 6B:
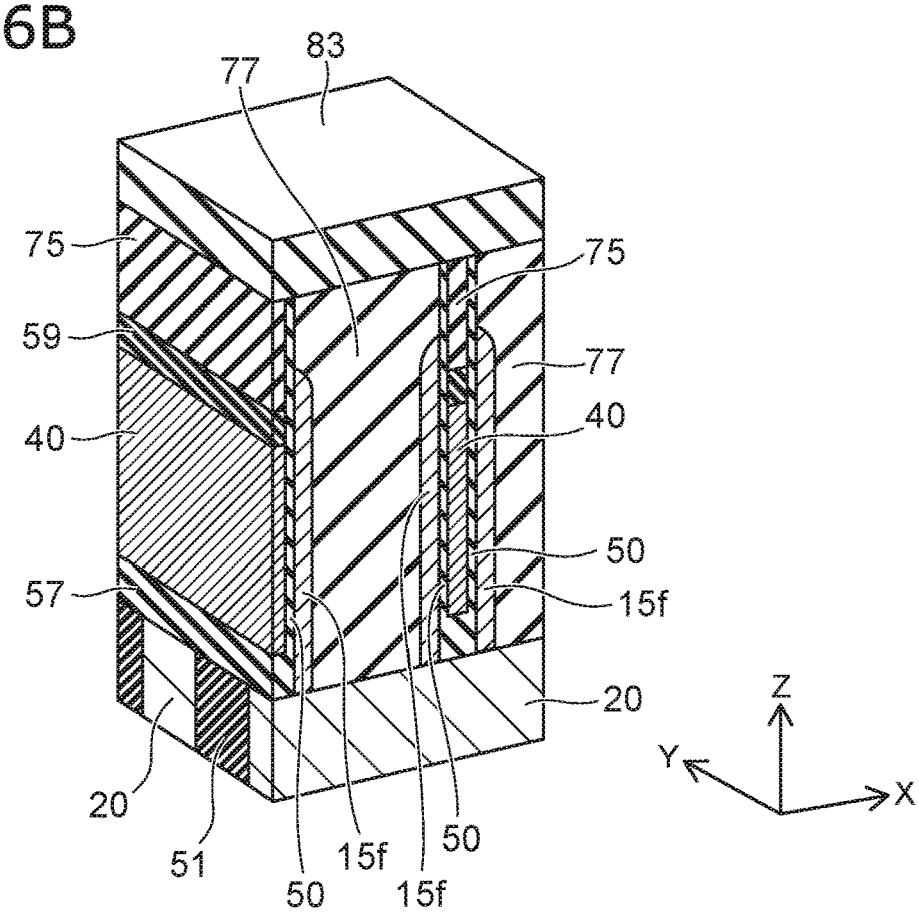

As shown in FIG. 6B, gate insulating films 50 and semiconductor films 15*f* are formed on both side surfaces of the gate electrodes 40. For example, a gate insulating film 50 and a semiconductor film 15*f* (not shown) are formed so as to cover the stacked bodies each including a part of the insulating film 57, a gate electrode 40, a part of the insulating film 59 and a mask layer 75. The gate insulating film 50 and the semiconductor film 15*f* are to be divided into multiple parts, i.e., the gate insulating films 50 and semiconductor films 15*f*. Subsequently, the N-type impurity is ion-implanted into the portions of the semiconductor film 15*f* at the top ends of the stacked bodies and on the portions of the first interconnections 20 and the insulating films 51 exposed to the spaces between the stacked bodies. Then, the N-type impurity is diffused by a heat treatment into the portions serving as the source region 13 and the drain region 17 (see FIG. 5B).

Subsequently, the portions of the gate insulating film 50 and the semiconductor film 15*f* are selectively removed, for example, using anisotropic RIE (Reactive Ion Etching), which cover the top ends of the mask layers 75, and the portions of the first interconnections 20 and the insulating films 51 exposed to the spaces between the stacked bodies. Thereby, parts of the gate insulating film 50 and the semiconductor film 15*f* remain on the side surfaces of the insulating films 57, the gate electrodes 40 and the insulating films 59.

Moreover, insulating films 77 is formed so as to fill the spaces between the stacked bodies. Further, a mask layer 83 is formed to cover the mask layers 75 and the insulating films 77. The insulating films 77 are formed from a material having etching selectivity with respect to the gate insulating films 50 and the insulating films 51. The gate insulating films 50 and the insulating films 51 are, for example, silicon oxide films, and the insulating films 77 are, for example, silicon nitride films.

Figure 7A:
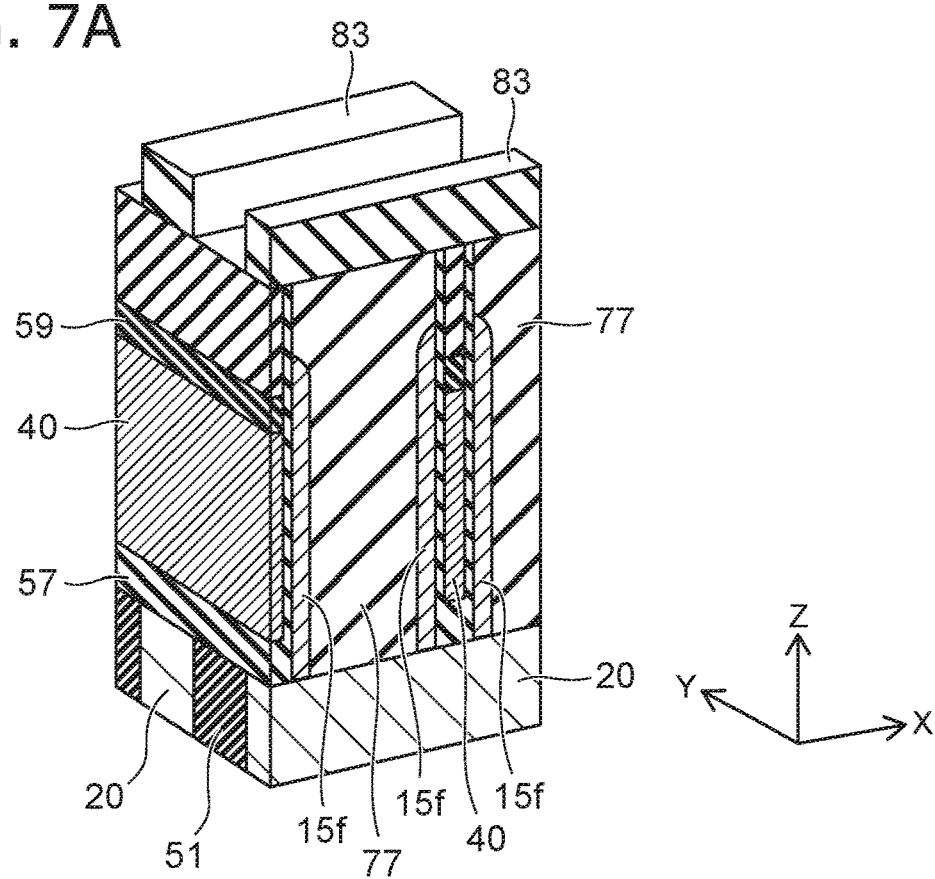

As shown in FIG. 7A, the mask layer 83 are formed into a line and space shape. The mask layer 83 is patterned into lines extending in the X-direction so that the top surfaces of the insulating films 77 are exposed to the spaces between the lines.

Subsequently, the insulating films 77 are selectively removed using the mask layer 83, and the semiconductor films 15f are exposed to the spaces (not shown) formed by removing the portions of the insulating films 77. Then, the portions of the semiconductor layer 15f are selectively removed, for example, using isotropic dry etching. Thereby, multiple semiconductor layers 15f (hereinafter, referred to as channel portions 15) are formed to be arranged in the Y-direction along the gate electrodes 40.

Figure 7B:
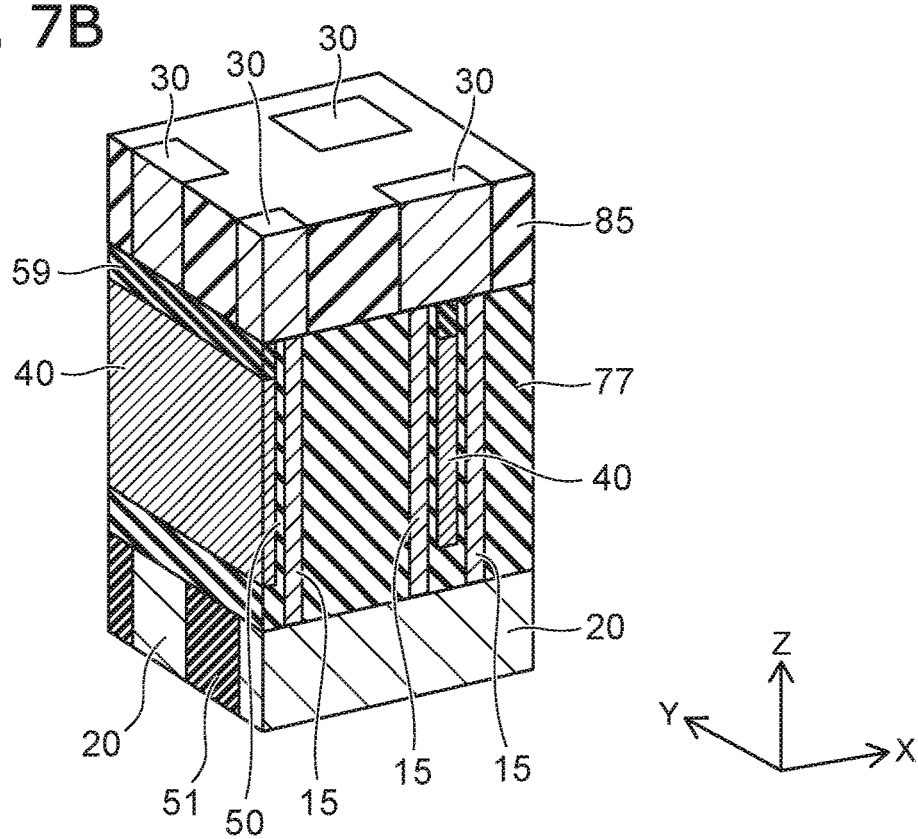

As shown in FIG. 7B, the second interconnections 30 are formed to be connected to the top ends of the channel portions 15. For example, the spaces formed by removing insulating film 77 are filled with insulating films (not shown), and then, the portion of the structure body positioned at a level upper than top ends of the insulating film 59 is removed using, for example, CMP (Chemical Mechanical Polishing). Then, an insulating film 85 is formed to cover the insulating films 59, the channel portions 15 and the insulating films 77. Subsequently, openings are formed from the top surface of the insulating film 85 to be in communication with the channel portions 15, and the second interconnections 30 or the connection part of the second interconnections 30 are formed in the openings.

In the manufacturing method described above, the gate electrodes 40 are formed before the channel portions 15 of the semiconductor layer 10 are formed. Thereby, downsizing the semiconductor layer 10 is achieved easier than the manufacturing method shown in FIG. 3A to FIG. 4B. For example, it is not easy in the process of forming the slit SV shown in FIG. 3C to suppress the width variation of the channel portion 15 in the X-direction. In contrast, it is easy in the manufacturing method shown in FIG. 6A to FIG. 7B to control the film thicknesses of the channel portions 15, since the semiconductor film 15f that is to be the channel portions 15 is formed, for example, using the CVD method. Thereby, the channel portions 15 are formed with uniform film thicknesses.

Figure 8:
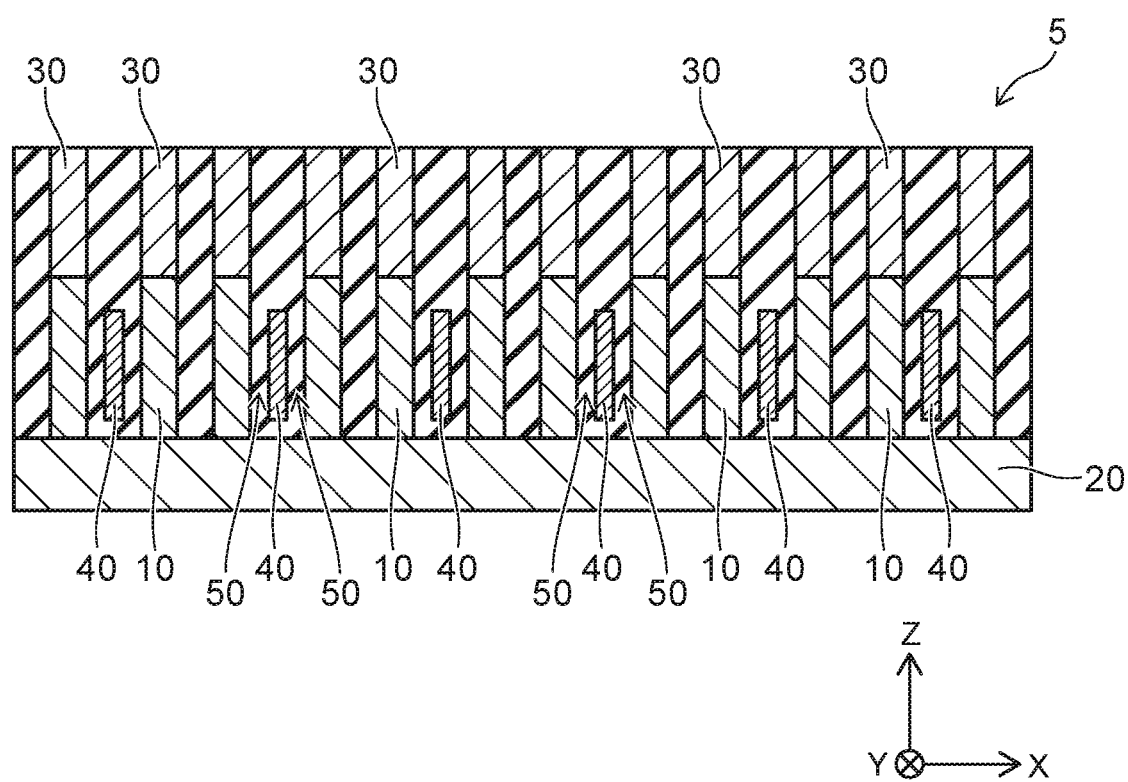
FIG. 8 is a schematic cross-sectional view showing a semiconductor device according to another variation of the embodiment.

FIG. 8 is a schematic cross-sectional view showing a semiconductor device 5 according to another variation of the embodiment. The semiconductor device 5 includes multiple semiconductor layers 10, gate electrodes 40, and second interconnections 30 placed above a first interconnection 20.

The second interconnections 30 are provided above the first interconnection 20 and connected to the first interconnection 20 via the semiconductor layers 10. The semiconductor layers 10 extend in the direction (Z-direction) crossing the surface of the substrate SB (not shown).

The gate electrodes 40 are disposed every other space between the semiconductor layers 10 arranged in the X-direction. A gate insulating film 50 is provided between a semiconductor layer 10 and a gate electrode 40.

The gate electrodes 40 each are shared by two semiconductor layers 10 being adjacent in the X-direction, and acts as control gates of electric currents flowing through the semiconductor layers 10. The gate electrodes 40 also extend in the Y-direction and, for example, each are also shared by other multiple semiconductor layers 10 arranged in the Y-direction (see FIG. 2A).

Also in the example, it is possible to suppress the increase of gate to gate parasitic capacity due to the reduction of the spacing between the semiconductor layers 10 arranged in the X-direction. Thereby, the reduction of operation speed can be avoided in the semiconductor device 5. The semiconductor device 5 can be used as the transistors Tr placed between a memorial cell array MCA and multiple global bit lines GB (see FIG. 2A).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a substrate;
a semiconductor layer provided above the substrate, the semiconductor layer including a first channel portion and a second channel portion, the first channel portion and the second channel portion extending in a first direction crossing a front surface of the substrate;
a first interconnection connected to one end of the semiconductor layer, and extending in a second direction along the front surface of the substrate;
a second interconnection connected to an other end of the semiconductor layer; and
a control electrode extending along the front surface of the substrate, the control electrode extending in a third direction crossing the second direction, the control electrode including a portion positioned between the first channel portion and the second channel portion, and the control electrode being electrically insulated from the semiconductor layer,
wherein the first channel portion and the second channel portion are combined together at one or both of the one end and the other end of the semiconductor layer.

2. The device according to claim 1, wherein the control electrode is positioned between the second interconnection and the first interconnection.

3. The device according to claim 1, wherein the second interconnection extends in the first direction.

4. The device according to claim 1, wherein the semiconductor layer includes a portion positioned between the first interconnection and the control electrode, the portion of the semiconductor layer being connected to the first channel portion and the second channel portion.

5. The device according to claim 1, wherein the semiconductor layer includes a portion positioned between the second interconnection and the control electrode, the portion of the semiconductor layer being connected to the first channel portion and the second channel portion.

6. The device according to claim 1, wherein:
the first channel portion and the second channel portion each have a first concentration of first conductivity type impurities in a portion facing the control electrode, and
the semiconductor layer has a second concentration of first conductivity type impurities in the one end and the other end, the second concentration being higher than the first concentration.

7. The device according to claim 1, wherein the semiconductor layer includes silicon.

8. The device according to claim 1, further comprising:
an insulating film including a portion positioned between the first channel portion and the control electrode and another portion positioned between the second channel portion and the control electrode.

9. The device according to claim 1, wherein:
the first interconnection is provided plurally, the first interconnections being arranged in the third direction,
the semiconductor layer is provided plurally, one of the semiconductor layers being placed above one of the first interconnections, an other one of the semiconductor layers being placed above an other one of the first interconnections, and
the control electrode includes a portion positioned between the first channel portion of the one of the semiconductor layers and the second channel portion of the one of the semiconductor layers, and a portion positioned between the first channel portion of the other one of the semiconductor layers and the second channel portion of the other one of the semiconductor layers.

10. The device according to claim 9, wherein:
the second interconnection is provided plurally, the second interconnections being connected to the semiconductor layers, respectively, and extending in the first direction;
a third interconnection is provided extending in the third direction above the first interconnections, and crossing the second interconnections; and
a memory film is placed between the third interconnection and one of the second interconnections.

11. The device according to claim 10, wherein the memory film includes a resistance change part, the resistance change part having an electrical resistance value reversibly changed depending on a voltage applied between the third interconnection and one of the second interconnections or an electric current flowing through the third interconnection and one of the second interconnections.

12. The device according to claim 10, wherein the memory film extends in the first direction along one of the second interconnections.

13. The device according to claim 10, wherein the memory film extends in the third direction along the third interconnection.

14. The device according to claim 10, further comprising:
an other third interconnection extending in the third direction and crossing the second interconnections above the first interconnections, the second interconnections being positioned between the third interconnection and the other third interconnection; and
an other memory film placed between the other third interconnection and one of the second interconnections.

* * * * *